United States Patent
Watabe et al.

(10) Patent No.: US 10,700,223 B2
(45) Date of Patent: Jun. 30, 2020

(54) HIGH PHOTOELECTRIC CONVERSION EFFICIENCY SOLAR BATTERY CELL AND METHOD FOR MANUFACTURING HIGH PHOTOELECTRIC CONVERSION SOLAR BATTERY CELL

(71) Applicant: SHIN-ETSU CHEMICAL CO., LTD., Tokyo (JP)

(72) Inventors: Takenori Watabe, Annaka (JP); Yoko Matsuo, Takasaki (JP); Hiroshi Hashigami, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 16 days.

(21) Appl. No.: 16/068,045

(22) PCT Filed: Dec. 1, 2016

(86) PCT No.: PCT/JP2016/005045
§ 371 (c)(1),
(2) Date: Jul. 3, 2018

(87) PCT Pub. No.: WO2018/100596
PCT Pub. Date: Jun. 7, 2018

(65) Prior Publication Data
US 2019/0252561 A1    Aug. 15, 2019

(51) Int. Cl.
*H01L 31/0224* (2006.01)
*H01L 31/048* (2014.01)
*H01L 31/18* (2006.01)

(52) U.S. Cl.
CPC .......... *H01L 31/022441* (2013.01); *H01L 31/022425* (2013.01); *H01L 31/0481* (2013.01);
(Continued)

(58) Field of Classification Search
CPC ..... H01L 31/022441; H01L 31/022425; H01L 31/0481; H01L 31/18
See application file for complete search history.

(56) References Cited

U.S. PATENT DOCUMENTS 5,344,498 A * 9/1994 Inoue ................ H01L 31/02167
136/251
8,217,403 B1  7/2012 Sekine et al.
(Continued)

FOREIGN PATENT DOCUMENTS

EP    3340314 A1    6/2018
EP    3340317 A1    6/2018
(Continued)

OTHER PUBLICATIONS

Jan. 9, 2019 Extended European Search Report in European Patent Application No. 16897470.7.
(Continued)

*Primary Examiner* — Jayne L Mershon
(74) *Attorney, Agent, or Firm* — Oliff PLC

(57) ABSTRACT

A solar battery cell including a finger electrode on a first main surface of a semiconductor substrate, the solar battery cell being including at least a surface of the finger electrode is covered with a material containing an insulating material so that the surface is not exposed, and the material containing the insulating material does not hydrolyze or does not generate a carboxylic acid when it hydrolyzes. Consequently, it is possible to provide a solar battery cell which suppresses a reduction in photoelectric conversion efficiency with time even though EVA is used and to provide a photovoltaic module using this solar battery cell.

12 Claims, 4 Drawing Sheets

(52) U.S. Cl.
CPC ............ *H01L 31/18* (2013.01); *Y02E 10/549* (2013.01); *Y02P 70/521* (2015.11)

(56) References Cited

U.S. PATENT DOCUMENTS

| | | | |
|---|---|---|---|
| 2010/0084001 | A1 | 4/2010 | Tsunomura et al. |
| 2011/0114179 | A1 | 5/2011 | Funakoshi |
| 2012/0037203 | A1* | 2/2012 | Sainoo .............. B32B 17/10018 |
| | | | 136/244 |
| 2013/0233381 | A1 | 9/2013 | Win et al. |
| 2014/0366928 | A1* | 12/2014 | Niinobe .............. H01L 31/0516 |
| | | | 136/246 |
| 2015/0187967 | A1 | 7/2015 | Chen |
| 2018/0013026 | A1 | 1/2018 | Hiraishi et al. |
| 2019/0305149 | A1 | 10/2019 | Watabe et al. |

FOREIGN PATENT DOCUMENTS

| | | |
|---|---|---|
| JP | H05-102511 A | 4/1993 |
| JP | H06-196741 A | 7/1994 |
| JP | 2007-207957 A | 8/2007 |
| JP | 2009-290105 A | 12/2009 |
| JP | 2011-086964 A | 4/2011 |
| JP | 2012-69594 A | 4/2012 |
| JP | 2013-058808 A | 3/2013 |
| TW | 2012-51065 A | 12/2012 |
| TW | 2013-35329 A | 9/2013 |
| WO | 2013/140622 A1 | 9/2013 |
| WO | 2016/153007 A1 | 9/2016 |
| WO | 2018/078666 A1 | 5/2018 |
| WO | 2018/078669 A1 | 5/2018 |

OTHER PUBLICATIONS

Sep. 5, 2018 Office Action issued in Taiwanese Patent Application No. 106108573.
Dec. 16, 2019 Office Action issued in European Patent Application No. 16897470.7.
Jan. 17, 2017 Search Report issued in International Patent Application No. PCT/JP2016/005045.
Jan. 17, 2017 Written Opinion issued in International Patent Application No. PCT/JP2016/005045.
Aug. 8, 2017 Office Action issued in Japanese Patent Application No. 2017-519700.
Jan. 19, 2018 Search Report in Taiwanese Patent Application No. 106108573.

* cited by examiner

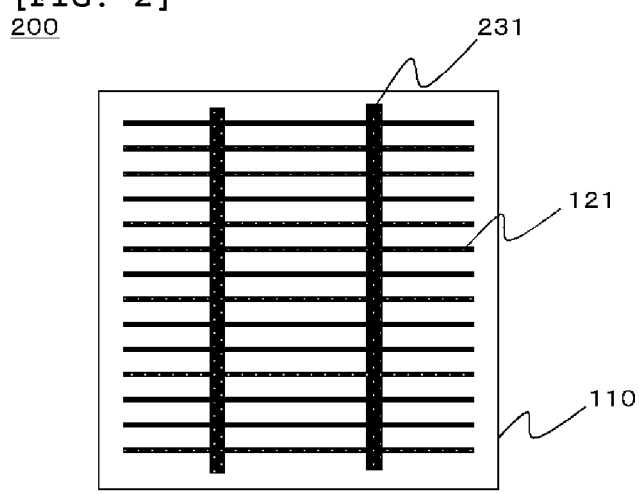
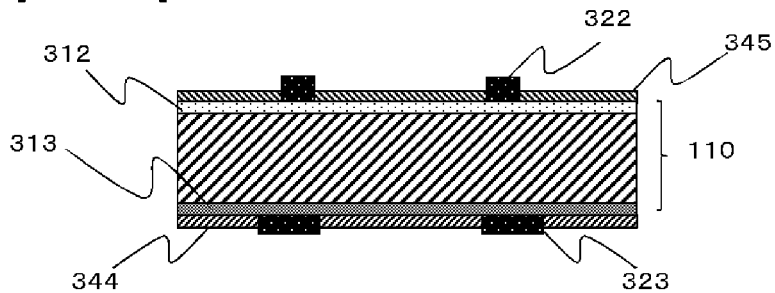
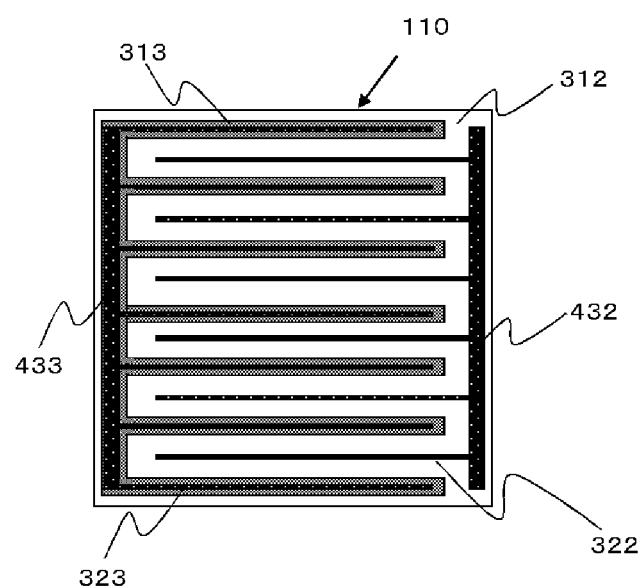

[FIG. 5]
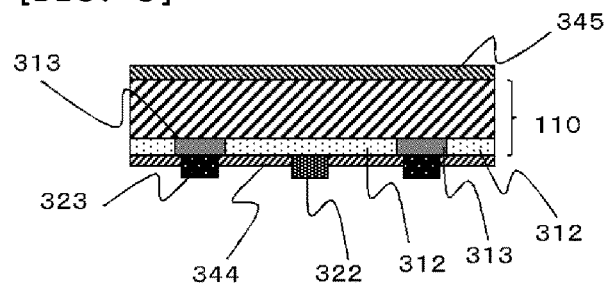
[FIG. 6]
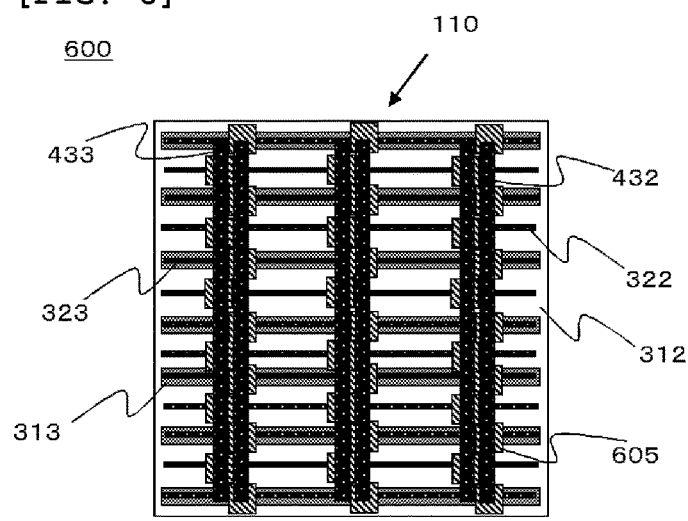
[FIG. 7]
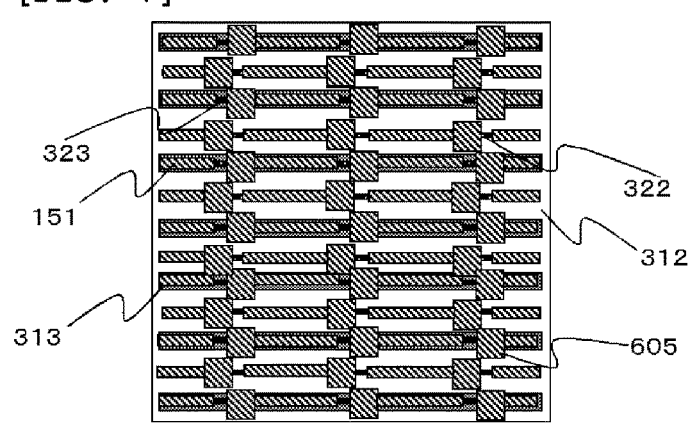
[FIG. 8]
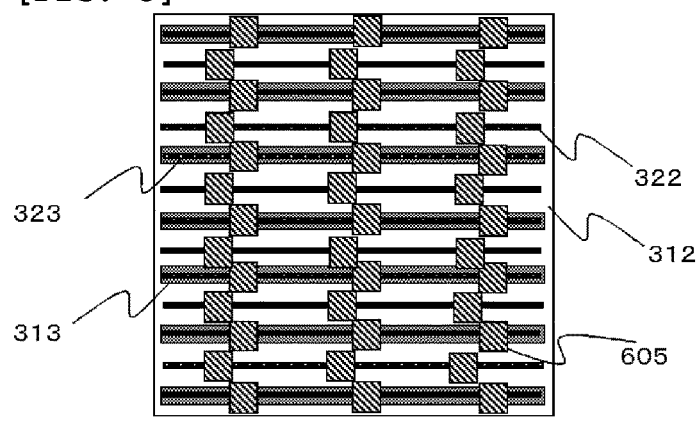

[FIG. 9]
900
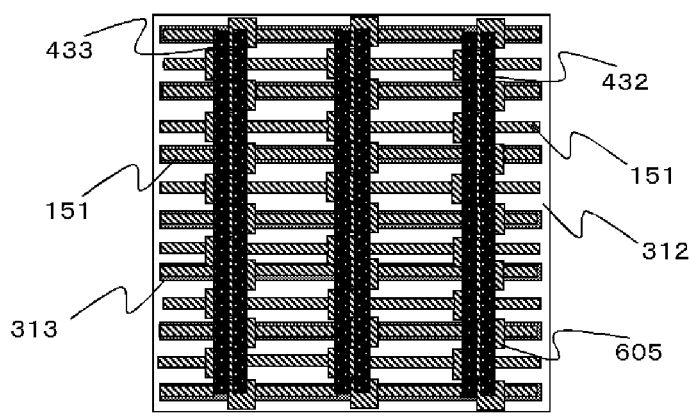
[FIG. 10]
1060
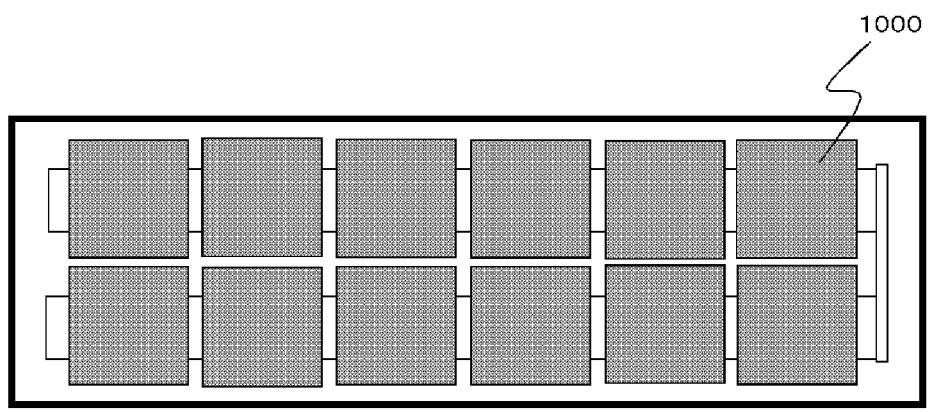
[FIG. 11]
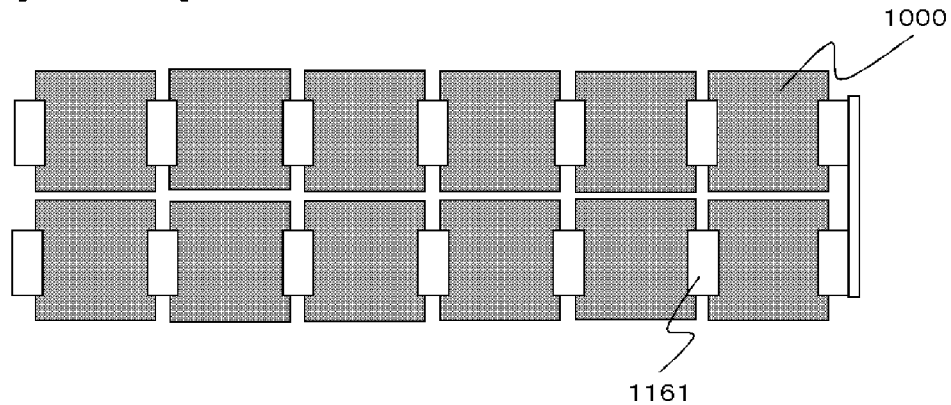

[FIG. 12]
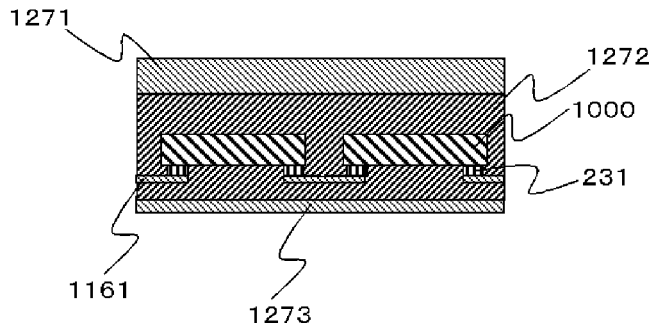
[FIG. 13]
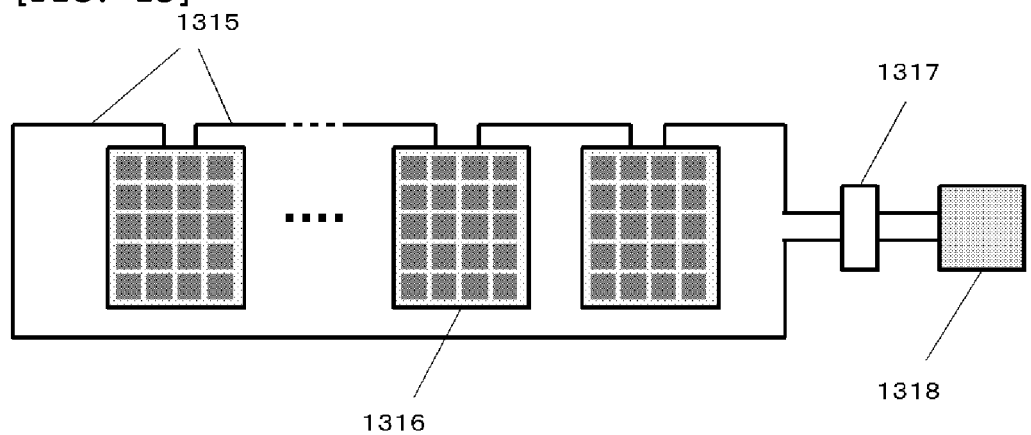
[FIG. 14]
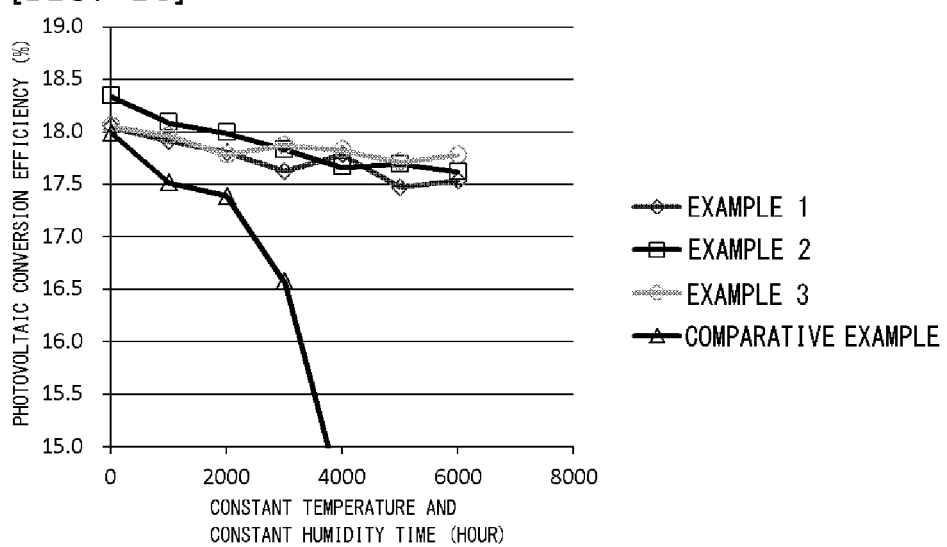

HIGH PHOTOELECTRIC CONVERSION EFFICIENCY SOLAR BATTERY CELL AND METHOD FOR MANUFACTURING HIGH PHOTOELECTRIC CONVERSION SOLAR BATTERY CELL

TECHNICAL FIELD

The present invention relates to a high photoelectric conversion solar battery cell and a method for manufacturing a high photoelectric conversion solar battery cell.

BACKGROUND ART

FIG. 2 shows an overview of a high photoelectric conversion efficiency solar cell using a single-crystal N-type silicon substrate, and FIG. 3 shows a schematic view of a cross-sectional structure of the same. A solar battery cell (which will be also simply referred to as a solar cell hereinafter) 200 has many electrodes having a width of 100 to tens of μm called finger electrodes (which will be also simply referred to as fingers hereinafter) 121 and 322 as collecting electrodes on a light receiving surface of an N-type substrate 110. As an interval of the finger electrodes adjacent to each other is generally approximately one to three mm. Further, two to four bus bar electrodes (which will be also simply referred to as bus bars hereinafter) 231 are provided as collecting electrodes to couple the solar battery cells. As methods for forming these electrodes, there are a vapor deposition method, a sputtering method, and the like, but a method for printing a metal paste having metal fine particles of Ag or the like mixed in an organic binder with the use of a screen plate or the like and performing a heat treatment at hundreds of degrees to bond the metal paste to a substrate is extensively used in terms of cost. Portions other than the electrodes are covered with an antireflection film 345 which is a silicon nitride film or the like. A P-type layer 312 which is opposite to a conductivity type of the substrate is formed on a front surface of the substrate. Finger electrodes 323 are also formed on a back surface side, and portions other than the electrodes are covered with a film 344 of silicon nitride or the like. A high-concentration N-type layer 313 having the same conductivity type as that of the substrate is formed on the outermost surface layer on the back surface.

Further, as a solar cell structure having high photoelectric conversion efficiency, there is a backside contact solar cell. FIG. 4 shows an overview of a back surface of a backside contact solar cell 400. On a back surface of a substrate 110, emitter layers 312 and base layers 313 are alternately aligned, and finger electrodes (emitter electrodes 322, base electrodes 323) are provided along upper sides of the respective layers. Furthermore, bus bar electrodes (an emitter bus bar electrode 432, a base bus bar electrode 433) to further collect currents obtained from these electrodes are provided. It is often the case that the bus bar electrodes are orthogonal to the finger electrodes because of their functions. A width of the emitter layer 312 is several mm to hundreds of and a width of the base layer 313 is hundreds of μm to tens of μm. Furthermore, an electrode width is generally approximately hundreds to tens of μm. FIG. 5 shows a schematic view of a cross-sectional structure of the backside contact solar cell 400. The emitter layers 312 and the base layers 313 are formed in the vicinity of the outermost surface layer on the back surface of the substrate 110. A layer thickness of each of the emitter layers 312 and the base layers 313 is no more than approximately 1 μm. The finger electrodes 322 and 323 are provided on the respective layers, and a surface of a non-electrode region (a region where no electrode is formed) is covered with a dielectric film (a backside protective film 344) which is a silicon nitride film, a silicon oxide film, or the like. For the purpose of reducing a reflection loss, an antireflection film 345 is provided on a light receiving surface side of the solar cell 400. Since no electrode is present on the light receiving surface, an incident light enters the substrate without being blocked, and hence photoelectric conversion efficiency is higher than that in the structure shown in FIG. 3.

The solar cell is processed into a photovoltaic module. FIG. 10 shows an overview of an example of a photovoltaic module. Solar cells 1000 fabricated as described above are laid like tiles in a photovoltaic module 1060. In the photovoltaic module 1060, several to tens of solar cells 1000 which are adjacent to each other are electrically connected in series to constitute a series circuit called a string. FIG. 11 shows an overview of the string. FIG. 11 corresponds to a schematic view of a back surface side in a module which cannot be usually seen. Moreover, fingers or bus bars are not shown. To achieve the series connection, as shown in FIG. 11, each P bus bar (a bus bar electrode connected to a finger electrode joined to a P-type layer of a substrate) of the solar cell 1000 is connected to each N bus bar (a bus bar electrode connected to a finger electrode joined to an N-type layer of the substrate) of an adjacent solar cell 1000 through a tab lead wire 1161 or the like. FIG. 12 shows a cross-sectional schematic view of the photovoltaic module. As described above, the string is constituted by connecting the plurality of solar cells 1000 through the tab lead wires 1161 connected to bus bar electrodes 231, respectively. The string is usually sealed in by a translucent filler 1272 such as EVA (ethylene vinyl acetate), a non-light receiving surface side is covered with a weatherable resin film 1273 such as PET (polyethylene terephthalate), and a light receiving surface is covered with a translucent light receiving surface protective material 1271 with high mechanical strength such as soda-lime glass.

CITATION LIST

Patent Literature

Patent Literature 1: Japanese Unexamined Patent Application Publication No. 2013-58808

DISCLOSURE OF INVENTION

Problem to be Solved by the Invention

It is known that, when EVA is used as the filler of the module, a decreasing amount of the photoelectric conversion efficiency of the module with time is large. For this reason, it is considered that moisture permeates the module in no small measure, EVA hydrolyzes to generate an acetic acid, and this acetic acid affects the electrodes.

In Patent Literature 1, electrode surfaces are covered with an adhesive which connects electrodes with lead wires, and the adhesive is also allowed to enter the electrodes to enhance bonding strength between the electrodes and a substrate. In the sense that direct contact between a filler and the electrodes is avoided, it can be said this is an effective method. However, according to this method, not only an unnecessary step, i.e., preparing the lead wires is required, but also there is a problem that positioning of the lead wires and the electrodes is not easy.

In view of the problem, it is an object of the present invention to provide a solar battery cell which suppresses a reduction in photoelectric conversion efficiency with time even though EVA is used and an easy method for manufacturing this cell.

Means for Solving Problem

To achieve the object, according to the present invention, there is provided a solar battery cell including a finger electrode on a first main surface of a semiconductor substrate, the solar battery cell being characterized in that at least a surface of the finger electrode is covered with a material containing an insulating material so that the surface is not exposed, and the material containing the insulating material does not hydrolyze or does not generate a carboxylic acid when it hydrolyzes.

When this solar battery cell is used to fabricate a photovoltaic module, the material containing the insulating material avoids direct contact between EVA and the electrode, and hence a reduction in bonding strength between the electrode and the substrate with time can be prevented. Additionally, when the substrate is damaged in a module manufacturing process or the like, the material containing the insulating material plays a role of securing damaged pieces of the substrate, a time for removing broken pieces can be reduced, and a downtime in manufacture of the module can be decreased.

Further, the material containing the insulating material can be a thermosetting material.

The thermosetting material containing the insulating material can be easily processed, which is preferable.

Furthermore, the material containing the insulating material can consist of a material containing at least one or more resins selected from a silicone resin, a polyimide resin, a polyamide imide resin, a polyamide resin, a fluorine resin, a phenol resin, a melamine resin, a urea resin, an epoxy resin, an acrylic resin, a polyester resin, and a poval resin.

Since these resins are chemically stable, have higher usable temperatures, and facilitate pattern formation, it is preferable for the material containing the insulating material in the solar battery cell according to the present invention to contain these resins.

Moreover, it is preferable for the first main surface to be a non-light receiving surface of the solar battery cell.

Even if the material containing the insulating material is a material which absorbs light, the photoelectric conversion characteristics of the non-light receiving surface are not lowered.

Additionally, in the present invention, there is provided a photovoltaic module including the solar battery cell according to the present invention incorporated therein.

As described above, the solar battery cell according to the present invention can be incorporated in the photovoltaic module.

In this case, the photovoltaic module may contain a filler, and the filler may be a material containing ethylene vinyl acetate.

The photovoltaic module of the present invention is hardly degraded with time even if the filler is ethylene vinyl acetate.

Further, in the present invention, there is provided a photovoltaic power generation system including the photovoltaic module according to the present invention.

As described above, the photovoltaic module having the solar battery cell according to the present invention incorporated therein can be used in the photovoltaic power generation system.

Further, in the present invention, there is provided a method for manufacturing a solar battery cell including the steps of:

forming a finger electrode on a first main surface of a semiconductor substrate; and covering at least a surface of the finger electrode with a material containing an insulating material so that the surface is not exposed, the method being characterized in that a material which does not hydrolyze or does not generate a carboxylic acid when it hydrolyzes is used as the material containing the insulating material.

When the photovoltaic module is fabricated by using the solar battery cell manufactured by this manufacturing method, since the material containing the insulating material can avoid the direct contact between EVA and the electrode, a reduction in bonding strength of the electrode and the substrate with time can be prevented. Furthermore, when the substrate is damaged in a module manufacturing process or the like, the material containing the insulating material plays a role of securing damaged pieces of the substrate, a time for removing broken pieces can be reduced, and a downtime in manufacture of the module can be decreased.

Moreover, a thermosetting material can be used as the material containing the insulating material.

The thermosetting material containing the insulating material can be easily processed, which is preferable.

Additionally, a material which consists of a material containing at least one or more resins selected from a silicone resin, a polyimide resin, a polyamide imide resin, a polyamide resin, a fluorine resin, a phenol resin, a melamine resin, a urea resin, an epoxy resin, an acrylic resin, a polyester resin, and a poval resin can be used as the material containing the insulating material.

Since these resins are chemically stable, have higher usable temperatures, and facilitate pattern formation, it is preferable for the material containing the insulating material to contain these resins in the method for manufacturing a solar battery cell according to the present invention.

Further, it is preferable for the first main surface to be a non-light receiving surface of the solar battery cell.

Even if the material containing the insulating material is a material which absorbs light, the photoelectric conversion characteristics of the non-light receiving surface are not lowered.

Furthermore, in the present invention, there is provided a method for manufacturing a photovoltaic module including using the solar battery cell according to the present invention to manufacture a photovoltaic module having the solar battery cell incorporated therein.

As described above, the solar battery cell according to the present invention can be used to manufacture the photovoltaic module.

In this case, the photovoltaic module may contain a filler, and a material containing ethylene vinyl acetate may be used as the filler.

According to the method for manufacturing a photovoltaic module of the present invention, even if the material containing ethylene vinyl acetate is used as the filler, the photovoltaic module which is hardly degraded with time can be manufactured.

Effect of the Invention

The solar battery cell according to the present invention has the high photoelectric conversion efficiency. Remarkably, in the solar battery cell according to the present invention, since the finger electrode is covered with the material (a material which does not hydrolyze or a material which does not generate a carboxylic acid when it is hydrolyzes) containing the insulating material other than EVA, the high photoelectric conversion efficiency can be maintained even if the solar battery cell is used for a long time. The method for manufacturing a solar battery cell according to the present invention can greatly improve time degradation after modularization by a relatively easy method. Moreover, when the material having the conductive material mixed therein is used, initial characteristics can be also improved. In case of applying the present invention to a backside contact solar cell, the number of production steps is not increased. Additionally, mechanical strength of the solar battery cell can be also improved.

BRIEF DESCRIPTION OF DRAWINGS

FIG. 1 is a cross-sectional schematic view showing an example of the vicinity of a finger electrode according to the present invention;

FIG. 2 is an overview diagram of a general double-sided electrode type solar cell to which the present invention can be applied;

FIG. 3 is a cross-sectional schematic view of the general double-sided electrode type solar cell to which the present invention can be applied;

FIG. 4 is a back overview diagram of a general backside contact solar cell to which the present invention can be applied;

FIG. 5 is a cross-sectional schematic view of the general backside contact solar cell to which the present invention can be applied;

FIG. 6 is a back overview diagram showing an example of a backside contact solar cell concerned in the present invention;

FIG. 7 is a view showing a back surface of a substrate after printing an insulating material in a pattern shape on fingers and regions where bus bars for different conductivity types cross the fingers in Example 1;

FIG. 8 is a view showing a back surface of a substrate after applying an insulating material only to regions where bus bars for different conductivity types cross fingers in Example 2;

FIG. 9 is a back overview diagram of a backside contact solar cell in each of Examples 1, 2, and 3;

FIG. 10 is an overview diagram of a general photovoltaic module to which the present invention can be applied;

FIG. 11 is a schematic view of an inside of a back surface of the general photovoltaic module to which the present invention can be applied;

FIG. 12 is a cross-sectional schematic view of the general photovoltaic module to which the present invention can be applied;

FIG. 13 is a schematic view showing an example of a photovoltaic power generation system according to the present invention; and FIG. 14 is a view showing changes in photoelectric conversion efficiency with time in Examples 1, 2, and 3 and Comparative Example according to the present invention.

BEST MODE(S) FOR CARRYING OUT THE INVENTION

The present invention will now be described hereinafter in detail.

It is known that a photovoltaic module using EVA (ethylene vinyl acetate) has insufficient humidity resistance and its photoelectric conversion efficiency is lowered due to aging. Thus, there has been demanded a solar battery cell which suppresses a decrease in photoelectric conversion efficiency with time even if EVA is used.

The present inventors have conducted the earnest studies to achieve the object. Consequently, they have discovered that the problem can be solved by a solar battery cell including a finger electrode on a first main surface of a semiconductor substrate, the solar battery cell being characterized in that at least a surface of the finger electrode is covered with a material containing an insulating material so that the surface is not exposed, and the material containing the insulating material does not hydrolyze or does not generate a carboxylic acid when it hydrolyzes, thereby bringing the present invention to completion.

Further, as described above, there has been demanded an easy method for manufacturing a solar battery cell which suppresses a decrease in photoelectric conversion efficiency with time even if EVA is used.

The present inventors have conducted the earnest studies to achieve the object. Consequently, they have discovered that the problem can be solved by a method for manufacturing a solar battery cell including the steps of:

forming a finger electrode on a first main surface of a semiconductor substrate; and covering at least a surface of the finger electrode with a material containing an insulating material so that the surface is not exposed, the method being characterized in that a material which does not hydrolyze or does not generate a carboxylic acid when it hydrolyzes is used as the material containing the insulating material, thereby bringing the present invention to completion.

In the following detailed description, to understand the overall invention and show how the invention is carried out in a given specific example, many given details will be explained. However, it can be understood that the present invention can be carried out without these given details. To avoid obscureness of the present invention, a known method, a procedure, and technologies will not be described in detail hereinafter. Although a given specific example of the present invention will be described with reference to given drawings, the present invention is not restricted thereto. The drawings described herein are schematic, and do not restrict the scope of the present invention. Further, in the drawings, for the purpose of illustration, sizes of several elements are exaggerated, and hence a scale may not be correct.

[Solar Battery Cell]

Features of a solar battery cell according to the present invention will now be described with reference to FIG. 1. FIG. 1 is a cross-sectional schematic view of the vicinity of a finger electrode of the solar battery cell according to the present invention. The solar battery cell according to the present invention has a finger electrode 121 on a first main surface of a semiconductor substrate 110. The solar battery cell according to the present invention is covered with a material (a layer containing an insulating material) 151 containing the insulating material so that a surface of the finger electrode 121 is not exposed. When this structure is provided, since the electrode is not directly in contact with a filler after modularization, time degradation due to the filler does not occur. For example, as the time degradation due to the filler, a case where EVA absorbs moisture and hydrolyzes to generate an acetic acid and this acid affects the electrode can be considered. Further, although a cause is not clear, a PID (Potential Induced Degradation: a reduction in module output due to application of a high voltage to the module) phenomenon is suppressed.

Furthermore, when this structure is provided, mechanical strength of the solar cell is enhanced. Specifically, since the material 151 containing the insulating material plays a role of securing a substrate, it is possible to reduce the number of broken pieces when the substrate is damaged. This can decrease a recovery time when the substrate is damaged in manufacture of a module or the like and also reduce a downtime of an apparatus.

For this reason, a width of the material 151 containing the insulating material which can cover at least the electrode can suffice and, for example, a maximum width which is 10 to 200 µm larger than an electrode width and a thickness of 1 to 20 µm measured from the electrode can suffice. Moreover, the material may cover the entire surface of the substrate as long as the electrode is covered.

Additionally, the material 151 containing the insulating material does not hydrolyze, or does not generate a carboxylic acid when it hydrolyzes. When this material is used, a problem that the electrode is affected by the material containing the insulating material itself does not occur. The material containing the insulating material is not restricted in particular as long as it has the properties, but it can be a thermosetting material. When the material containing the insulating material is a thermosetting type, it can be easily processed, which is preferable. More specifically, the material containing the insulating material may consist of a material containing at least one or more resins selected from a silicone resin, a polyimide resin, a polyamide imide resin, a polyamide resin, a fluorine resin, a phenol resin, a melamine resin, a urea resin, an epoxy resin, an acrylic resin, a polyester resin, and a poval resin. A mixture of these materials may be used, or metal powder or the like may be mixed to impart other functions. Since these resins are chemically stable, have high usable temperatures, and facilitate pattern formation, the material containing the insulating material preferably contains these resins in the solar battery cell according to the present invention. It is to be noted that, of these resins, resins which do not hydrolyze are the polyimide resin, the polyamide imide resin, the polyamide resin, the fluorine resin, the phenol resin, the melamine resin, the urea resin, the epoxy resin, the acrylic resin, the polyester resin, and the poval resin. Further, a resin which does not generate the carboxylic acid when it hydrolyzes is the silicone resin. EVA (i.e., a material which generates an acetic acid when it hydrolyzes) cannot be used since it is apt to degrade when modularization is performed.

In a case where the material containing the insulating material is a material which absorbs light, it can be used on a non-light receiving surface side. That is, it is preferable for the first main surface to be the non-light receiving surface of the solar battery cell. When the material is used on the non-light receiving surface side, the photoelectric conversion efficiency is not lowered due to the material containing the insulating material. No problem occurs when a material which does not absorb the light (for example, a wavelength range of approximately 300 to 1200 nm) is used on a light receiving surface. Furthermore, the finger electrodes may be covered with the material containing the insulating material on both the light receiving surface and the non-light receiving surface.

It is to be noted that, though not shown, a high-concentration dopant layer may be formed immediately below the electrodes, and a dielectric film like a silicon nitride film may be formed on the substrate surface.

In the solar battery cell according to the present invention, arrangement of the finger electrodes is not restricted in particular. The present invention can be applied to all of the conventional solar battery cells (structures shown in FIGS. 2 to 5). That is, the finger electrodes exposed to the outside in FIGS. 2 to 5 can be covered with the material containing the insulating material so that the surfaces of the finger electrodes are not exposed, thereby providing the solar battery cell according to the present invention.

Moreover, the present invention can be also applied to a structure where a plurality of bus bars shown in FIG. 6 are arranged in a substrate. FIG. 6 is a back overview drawing showing an example of a backside contact solar cell. As shown in FIG. 6, a solar cell 600 includes a semiconductor substrate 110. Here, the semiconductor substrate 110 has a first conductivity type. Additionally, on a first main surface of the semiconductor substrate 110 are provided an emitter layer 312 having a second conductivity type which is a conductivity type opposite to the first conductivity type, emitter electrodes 322 which are in contact with the emitter layer 312, base layers 313 having the first conductivity type, base electrodes 323 which are in contact with the base layers 313, and insulator films 605 which prevent an electrical short-circuit between the emitter layer 312 and the base layers 313. Further, as shown in FIG. 6, the solar cell 600 includes base bus bar electrodes 433 to further collect currents provided from the base electrodes 323. Furthermore, it also includes emitter bus bar electrodes 432 to further collect currents provided from the emitter electrodes 322.

In the present invention, finger electrodes exposed to the outside in FIG. 6 are covered with the material containing the insulating material so that surfaces of the finger electrodes are not exposed. FIG. 9 shows a configuration in which this structure, i.e., the finger portions in FIG. 6 are covered with the material containing the insulating material. FIG. 9 is a back overview drawing of the backside contact solar cell according to the present invention, and a backside contact solar cell having this structure is manufactured in later-described examples. As shown in FIG. 9, a solar cell 900 is covered with a material 151 containing an insulating material so that surfaces of finger electrodes (base electrodes 323, emitter electrodes 322) exposed to the outside in FIG. 6 are not exposed. Structures other than the material 151 containing the insulating material in FIG. 9 are the same as those in FIG. 6, and hence a description thereof will be omitted. As shown in FIG. 9, the material containing the insulating material may have a shape parallel to each finger electrode. In this case, as compared with a case where the material containing the insulating material is formed on the entire surface, an area of the material containing the insulating material can be reduced. Consequently, a used amount of the material containing the insulating material can be reduced, which is economical. On the other hand, the material containing the insulating material can be formed on the entire surface. In this case, since the material containing the insulating material does not have to be formed into a pattern, easy formation can be realized, and the finger electrodes and the material containing the insulating material do not have to be positioned.

As described above, according to the solar battery cell of the present invention, when modularization is performed, since the material containing the insulating material is interposed between the filler and the finger electrodes, the filler is not in contact with the finger electrodes. Thus, the time degradation due to the filler does not occur.

[Photovoltaic Module]

Moreover, in the present invention, there is provided a photovoltaic module characterized by having the solar battery cell according to the present invention incorporated therein. In this manner, the solar battery cell according to the present invention can be incorporated in the photovoltaic module. Although a structure of the photovoltaic module is not restricted in particular, the structure shown in FIGS. 10 to 12 can be adopted. As shown in FIG. 12, in the present invention, each solar battery cell 1000 in a photovoltaic module 1060 may be covered with a filler 1272 except for positions connected with tab lead wires 1161. As described above, the solar battery cell according to the present invention is covered with a material containing an insulating material so that surfaces of finger electrodes are not exposed. Thus, even if each solar battery cell according to the present invention is covered with the filler 1272 except for the positions connected to the tab lead wires 1161 when modularization is performed, direct contact between the finger electrodes and the filler can be avoided. Thus, the time degradation due to the filler does not occur. Therefore, the present invention can be applied to the photovoltaic module having the structure shown in FIG. 12.

In this case, the photovoltaic module includes the filler, and the filler may be a material containing ethylene vinyl acetate. As described above, the photovoltaic module according to the present invention is hardly degraded with time even if the filler is made of ethylene vinyl acetate.

[Method for Manufacturing Solar Battery Cell]

A specific method for manufacturing a solar cell will now be described hereinafter while taking an N-type substrate as an example. It is to be noted that an example where a first main surface is a back surface (a non-light receiving surface) will be described hereinafter.

First, high-purity silicon is doped with a pentad such as phosphorous, arsenic, or antimony to prepare an as-cut single crystal {100} N-type silicon substrate having a specific resistance of 0.1 to 5 Ω·cm. The single-crystal silicon substrate may be fabricated by any one of a CZ (Czochralski) method and an FZ (Floating zone) method. The substrate does not have to be necessarily made of single-crystal silicon, and it may be made of polycrystalline silicon.

Then, mechanical damage on the substrate surface formed at the time of slicing or cutting is subjected to etching using, e.g., a high-concentration alkali such as sodium hydroxide or potassium hydroxide having concentration of 5 to 60% or a mixed acid of a hydrofluoric acid and a nitric acid. Depending on conditions for texture formation as a subsequent step, this mechanical damage removal step is not necessarily required, and it can be omitted.

Subsequently, small irregularities called a texture are formed on the substrate surface. The texture is an effective method to reduce a reflectance of the solar cell. The texture is fabricated by immersion in a heated solution (concentration: 1 to 10%, temperature: 60 to 90° C.) of alkali such as sodium hydroxide, potassium hydroxide, potassium carbonate, sodium carbonate, or sodium hydrogencarbonate for approximately 10 minutes to 30 minutes. A certain amount of 2-propanol is often dissolved in the solution to promote a reaction.

After forming the texture, the substrate having the texture formed thereon as described above is cleaned in an acid aqueous solution of, e.g., a hydrochloric acid, a sulfuric acid, a nitric acid, a hydrofluoric acid, or a mixture of these members. A hydrogen peroxide can be mixed to improve cleanliness.

Subsequently, a P-type diffusion layer is formed. For formation of the P-type layer, a vapor phase diffusion method and a coating diffusion method can be used and any one of these methods can be used. As an example of the vapor phase diffusion method, it is possible to adopt a method for stacking two substrates as a pair, putting them in a heat treatment furnace in this state, leading a mixed gas of $BBr_3$ and oxygen, and performing a heat treatment at 950 to 1050° C. As a carrier gas, nitrogen or argon is preferable. As an example of the coating diffusion method, it is possible to adopt a method for applying a coating agent containing a boron source to an entire first main surface and performing a heat treatment at 950 to 1050° C. As the coating agent, it is possible to use, for example, an aqueous solution containing 1 to 4% of boric acid as the boron source and 0.1 to 4% of polyvinyl alcohol as a thickener.

Then, an N-type layer is formed. To form the N-type layer, the vapor phase diffusion method or the coating diffusion method can be used, and any one of these methods can be used. As an example of the vapor phase diffusion method, it is possible to adopt a method for stacking two substrates as a pair, putting them in a heat treatment furnace in this state, and performing a heat treatment at 830 to 950° C. in a mixed gas atmosphere of phosphorous oxychloride, nitrogen, and oxygen. The coating diffusion method is a method for spin-coating a material containing phosphorous, performing printing it or the like, and then carrying out a heat treatment, and any method can be used.

Then, glass on the surface is removed with the use of the hydrofluoric acid or the like.

Then, an antireflection film is formed on a light receiving surface. As the antireflection film, a silicon nitride film, a silicon oxide film, or the like can be used. In case of the silicon nitride film, a plasma CVD apparatus is used to form the film of approximately 100 nm. As a reactant gas, monosilane ($SiH_4$) and ammonia ($NH_3$) are often mixed and used, but nitrogen can be likewise used in place of $NH_3$, or hydrogen is mixed in the reactant gas in some cases to adjust a process pressure and dilute the reactant gas. In case of the silicon oxide film, the CVD method may be used, but higher characteristics can be provided in a film formed by a thermal oxidation method.

It is desirable to likewise form a protective film which is the silicon nitride film or the silicon oxide film on a back surface like the light receiving surface. To enhance a protection effect on the surface, a thin aluminum oxide film or a thermal oxide film of approximately 1 to 20 nm may be formed on the substrate surface in advance, and the silicon nitride film or the silicon oxide film may be formed.

Subsequently, each finger electrode is formed on the first main surface of the semiconductor substrate. First, as a backside electrode, for example, a paste containing Ag powder is formed by a screen printing method. A printing pattern is a comb-tooth shape, and it is easiest to form the finger and a bus bar electrode at the same time. It is preferable for a finger width to be approximately 40 to 200 μm and for a bus bar width to be approximately 0.5 to 2 mm.

The screen printing method is also used for formation of light receiving surface electrodes, and an Ag paste provided by mixing the Ag powder and glass frit with an organic binder is printed. A printing pattern is the comb-tooth shape like the back surface, and it is easiest to form the finger and the bus bar at the same time. It is preferable for a finger width to be approximately 40 to 100 μm and for a bus bar width to be approximately 0.5 to 2 mm.

After the electrode printing on the front and back surfaces, the Ag powder is penetrated through (fire-through) the silicon nitride film by a heat treatment (baking) so that the electrodes can be conducive with silicon. Baking of the electrodes on the back surface and that of the electrodes on the light receiving surface can be performed at a time, or they may be separately performed. The baking is carried out by performing a treatment at a temperature of 700 to 850° C. for several seconds to several minutes.

At last, a layer containing an insulating material is formed on each finger electrode. That is, at least a surface of the finger electrode is covered with the material containing the insulating material so that the surface is not exposed. In the method for manufacturing a solar battery cell according to the present invention, as the material containing the insulating material, a material which does not hydrolyze or which does not generate a carboxylic acid when it hydrolyzes is used. Particulars of the material containing the insulating material are as described in the section of the solar battery cell. A paste-like insulating material is prepared in advance, and it is applied by screen printing, a dispenser, or the like. It may be applied along each finger electrode or may be applied to the entire substrate surface. Further, when the insulating material is transparent, a reduction in conversion efficiency does not occur even though the insulating material is used on the light receiving surface side. Furthermore, the material is not restricted to the insulating material. That is, a resin or the like having particles or Ag, Cu, or the like dispersed therein may be used. In this case, a cross-sectional area of the finger electrode is substantially increased, and an electrical resistance as the finger electrode can be decreased. When such a material is used on the back surface, the conversion efficiency is improved.

As described above, the material containing the insulating material can contain conductive particles of silver or the like. Here, as for the reason why the acetic acid generated by hydrolysis of EVA affects the conversion efficiency, it can be considered that contact resistance between the finger electrode (a contact electrode) and the substrate is degraded rather than the conductive particles of, e.g., silver themselves contained in the finger electrode (the contact electrode) which is directly joined to the semiconductor substrate of the solar battery cell. Thus, in a case where the material containing the insulating material contains the conductive particles, even if the material containing the insulating material is affected by the acetic acid, the finger electrode present below the material is left unharmed, and hence the conversion efficiency is not lowered. That is, it can be considered that the covering the finger electrode with the material enables suppressing degradation of the contact resistance of the finger electrode. It is to be noted that, in the present invention, the bus bar electrode does not have to be covered with the material containing the insulating material. That is because, like the above description, the conversion efficiency does not become poor as long as the finger electrode (the contact electrode) alone is basically protected, namely, no problem occurs in particular even if the bus bar electrode is affected by the acid to some extent. That is, a gist of the present invention is basically to maintain the contact resistance between the finger electrode and the substrate, and hence no problem arises in particular even if the bus bar electrode which does not have to be directly in contact with the substrate is not covered.

Although the example of the N-type substrate has been described above, in case of a P-type substrate, phosphorous, arsenic, antimony, or the like could be diffused in formation of the N-type layer, boron, Al, or the like could be diffused in formation of the P-type layer, and the method for manufacturing a solar battery cell according to the present invention can be used.

Furthermore, an example of application to a backside contact solar cell will be also described hereinafter.

An example of the N-type substrate will be described. An N-type silicon substrate is prepared, and slice damage on a surface is subjected to etching using, e.g., a high-concentration alkali or a mixed acid of a hydrofluoric acid and a nitric acid. The single-crystal silicon substrate may be fabricated by using any one of the CZ method and the FZ method. The substrate does not necessarily have to be made of single-crystal silicon, and it may be made of polycrystalline silicon.

Subsequently, a texture is formed on a substrate surface by the foregoing method.

After forming the texture, the substrate having the texture formed thereon as described above is cleaned in an acid aqueous solution of, e.g., a hydrochloride acid, a sulfuric acid, a nitric acid, a hydrofluoric acid, or a mixture of these members. A hydrogen peroxide can be mixed to improve cleanliness.

On a first main surface of this substrate, an emitter layer is formed. The emitter layer has a conductivity type (a P type in this case) which is opposite to that of the substrate, and has a thickness of approximately 0.05 to 1 μm. The emitter layer can be formed by the vapor phase diffusion using $BBr_3$ or the like. Further, it can be formed by a method for applying a coating agent containing a boron source to the first main surface and performing a heat treatment.

After forming the emitter layer, a mask for formation of a base layer as a subsequent step is formed on both main surfaces. As the mask, a silicon oxide film, a silicon nitride film, or the like which is a dielectric film can be used. When the CVD method is adopted, appropriately selecting a gas type to be introduced enables forming any film. In case of the silicon oxide film, this film can be formed by thermally oxidizing the substrate. When the substrate is subjected to the heat treatment in an oxygen atmosphere at 950 to 1100° C. for 30 minutes to 4 hours, a silicon thermal oxide film of approximately 100 nm is formed. A film thickness can be arbitrarily changed by appropriately selecting a temperature, a time, a gas, and others, but setting a film thickness of 30 to 300 nm is preferable to achieve both a mask function and easiness of partial opening in a subsequent step. This heat treatment may be carried out in the same batch following the heat treatment for formation of the emitter layer.

Then, the mask in each part which serves as a base region is partially removed (opened). Specifically, opening is performed to form a parallel line shape so that an opening width becomes 50 μm to 250 μm and each interval becomes approximately 0.6 mm to 2.0 mm. To perform the opening, a photolithography method or an etching paste can be adopted, but opening using a laser is easy and preferable. As a laser source, second harmonic waves of a YAG type, a $YVO_4$ type, $GdVO_4$ type, or the like can be used, but any laser source can be used as long as its wavelength is approximately 500 to 700 nm. Although laser conditions can be appropriately decided, it is possible to set, e.g., an output of 4 to 20 W, a frequency of 10000 to 100000 Hz, a fluence of 1 to 5 J/cm², a galvo head, a scan speed of 100 to 5000 mm/second, and others.

After opening the mask, the substrate is immersed in an aqueous solution of alkali, e.g., KOH or NaOH heated to 50 to 90° C. to remove (etch) the unnecessary emitter layer present in the opening portion.

To form the base layer, a vapor phase diffusion method using phosphorus oxychloride can be used. Besides the vapor phase diffusion method, the base layer can be likewise formed by a method for performing a heat treatment after spin-coating or printing a material containing the phosphorus.

After forming the diffused layer, the mask and glass formed on the surface are removed by using a hydrofluoric acid or the like.

Then, an antireflection film on the second main surface is formed. As the antireflection film, a silicon nitride film or a silicon oxide film can be used.

On the first main surface, a surface protective film is also formed. As the surface protective film, a silicon nitride film or a silicon oxide film can be used.

Then, the finger electrodes (the base electrode and the emitter electrode) are formed on the first main surface of the semiconductor substrate. Specifically, the base electrode is formed by, e.g., a screen printing method. For example, a plate having an opening width of 30 μm to 200 μm and a parallel line pattern with intervals of 0.6 to 2.0 mm is prepared in advance, and an Ag paste provided by mixing an Ag powder and glass frit with an organic binder is printed along the base layer. Likewise, the Ag paste is printed as the emitter electrode. The Ag paste for the base electrode and the Ag paste for the emitter electrode may be the same, or different pastes may be used. After the electrode printing, the Ag powder is penetrated through (fire-through) the silicon nitride film by a heat treatment so that the electrodes can be conducive with silicon. It is to be noted that the base layer electrode and the emitter layer electrode can be separately baked. Baking is usually achieved by performing a treatment at a temperature of 700 to 850° C. for five to 30 minutes.

Although the bus bars may be arranged at both ends of the substrate as shown in FIG. 4, the plurality of bus bars may be arranged in the substrate as shown in FIG. 6. A case where the method for manufacturing a solar battery cell according to the present invention is applied to the backside contact solar cell will now be described with reference to FIGS. 6 to 9. As shown in FIG. 9, according to the method for manufacturing a solar battery cell of the present invention, the surfaces of the finger electrodes 322 and 323 are covered with the material 151 containing the insulating material so that they are not exposed. Further, as the material containing the insulating material, a material which does not hydrolyze or which does not generate a carboxylic acid when it hydrolyzes is used. Particulars of the material containing the insulating material are as described in the section of the solar battery cell.

First, the insulating material is applied in a pattern shape. It is applied in the pattern shape so that each N bus bar (in this case, a base bus bar electrode connected with the base electrode) does not become conductive with the emitter electrode and each P bus bar (in this case, an emitter bus bar electrode connected with the emitter electrode) does not become conductive with the base electrode. Furthermore, in the present invention, the insulating material can be applied to the upper sides of the fingers at the same time. Although the insulating material can be applied to the entire substrate surface, conductive portions between the bus bars and the fingers must be assured (see FIG. 7). For the application, the screen printing method or the like can be used. After the application, curing is performed at 100 to 400° C. for one to 60 minutes. FIG. 7 is a view showing the back surface of the substrate after the insulating material is printed in the pattern shape on the fingers and regions where the bus bars for different conductivity types cross the fingers (which will be also referred to as bus bar portions hereinafter), and the insulating material is printed in this manner in Example 1 which will be described later. As shown in FIG. 7, in the conductive portions of the bus bars and the fingers, the emitter electrodes 322 and the base electrodes 323 are exposed. The emitter electrodes 322 and the base electrodes 323 formed in regions other than the conductive portions are covered with the material 151 containing the insulating material. It is to be noted that the bus bars are formed on the exposed portions at a next step, and hence the exposed portions do not directly come into contact with the filler when modularization is performed.

At last, the bus bars are formed. The N bus bars (the base bus bar electrodes) are connected with the base electrodes, the P bus bars (the emitter bus bar electrodes) are connected with the emitter electrodes, the N bus bars and the emitter electrodes are provided to interpose an insulator layer therebetween, and the P bus bars and the base electrodes are provided to interpose the same therebetween, respectively. As a bus bar material, a low-temperature curing conductive paste can be used. Specifically, it is possible to use one or more conductive materials selected from Ag, Cu, Au, Al, Zn, In, Sn, Bi, and Pb and, further, a material containing one or more resins selected from a silicone resin, a polyimide resin, a polyamide imide resin, a polyamide resin, a fluorine resin, a phenol resin, a melamine resin, a urea resin, an epoxy resin, an acrylic resin, a polyester resin, and a poval resin. The material is applied in the pattern shape by using, e.g., the screen printing method or a dispenser, and then cured at 100 to 400° C. for approximately one to 60 minutes. It is to be noted that the insulating material may be applied to the bus bar portions alone and the low-temperature curing conductive paste may be applied to the upper sides of the fingers as the material containing the insulating material (see FIG. 8). FIG. 8 is a view showing the back surface of the substrate after applying the insulating material to the bus bar portion only, and the insulating material is applied in this manner in Example 2 which will be described later. In a mode shown in FIG. 8, printing the material containing the insulating material on the bus bar portions only is the same as that in case of the multi bus bars shown in FIG. 6. However, thereafter, the low-temperature curing conductive paste is also printed on the fingers concurrently with the bus bars. In this case, a cross-sectional area of the finger electrodes is substantially increased, and an electrical resistance as the finger electrodes can be reduced, thereby improving the conversion efficiency. It is to be noted that, in the method for manufacturing a solar battery cell of the present invention, covering the finger electrodes so that they are not exposed eventually can suffice, and the insulating material can be applied at two separate steps as described above.

Although the example of the N-type substrate has been described above, in case of a P-type substrate, phosphorous, arsenic, antimony, or the like could be diffused in formation of the emitter layer, boron, Al, or the like could be diffused in formation of the base layer, and the method for manufacturing a solar battery cell according to the present invention can be used.

[Method for Manufacturing Photovoltaic Module]

The solar cell fabricated as described above can be used in a photovoltaic module. That is, the present invention provides a method for manufacturing a photovoltaic module characterized by using the solar battery cells of the present invention to manufacture a photovoltaic module having the solar battery cells incorporated therein. In this manner, it is possible to use the solar battery cells of the present invention to manufacture the photovoltaic module.

In this case, the photovoltaic module may contain a filler, and a material containing ethylene vinyl acetate may be used as the filler. According to the method for manufacturing a photovoltaic module of the present invention, even if the material containing ethylene vinyl acetate is used as the filler, the photovoltaic module which is hardly degraded with time can be manufactured.

For example, a photovoltaic module having a structure shown in FIGS. 10 to 12 described above can be manufactured. To achieve series connection, as shown in FIG. 11, a P bus bar (a bus bar electrode connected to a finger electrode joined to a P-type layer of a substrate) and an N bus bar (a bus bar electrode connected to a finger electrode joined to an N-type layer of the substrate) of solar cells 1000 adjacent to each other are connected through a tab lead wire 1161 or the like. Solder or the like can be used for the connection, and the plurality of solar cells are connected to provide a string.

The string is held in a translucent filler 1272 such as EVA, a weatherable resin film 1273 of PET or the like is placed on a non-light receiving surface side, a translucent light receiving surface protective material 1271 with high mechanical strength such as soda-lime glass or the like is placed on a light receiving surface side, and a pressure is applied while heating. As the filler 1272, it is possible to use polyolefin, silicone, ionomer, or the like can be used besides the EVA.

[Photoelectric Power Generation System]

Moreover, a photovoltaic power generation system can be constituted by using this module. That is, the present invention provides a photovoltaic power generation system characterized by having the photovoltaic modules according to the present invention. FIG. 13 shows a basic structure of the photovoltaic power generation system having the modules of the present invention coupled with each other. A plurality of photovoltaic modules 1316 are coupled in series through wiring lines 1315, and supply generated electric power to an external load circuit 1318 through an inverter 1317. Although not shown, the system may further include a secondary cell which stores the generated electric power.

EXAMPLES

The present invention will now be more specifically described hereinafter with reference to examples and a comparative example, but the present invention is not restricted to the example.

A backside contact solar cell was fabricated by using the method for manufacturing a solar battery cell according to the present invention. A photovoltaic module including this backside contract solar cell was also fabricated. It is to be noted, in each of Examples 1 to 3, a solar cell shown in FIG. 9 was fabricated as the backside contact solar cell. In a comparative example, a solar cell shown in FIG. 6 was fabricated as the backside contact solar cell.

Example 1

A damage layer was removed from each phosphorus-doped {100} N-type as-cut silicon substrate each having a thickness of 200 µm and a specific resistance of 1 Ω·cm by a hot concentrated potassium hydroxide aqueous solution, thereafter the substrate was immersed into a potassium hydroxide/2-propanol aqueous solution of 72° C. to form a texture, and then it was cleaned in a hydrochloric acid/hydrogen peroxide mixed solution heated to 75° C.

Subsequently, the two substrates were stacked as a pair and put into a heat treatment furnace in this state, a mixed gas of $BBr_3$, oxygen, and argon was introduced, and a heat treatment was carried out at 1000° C. for 10 minutes. Consequently, an emitter layer was formed. As a result of measurement based on a four-point probe method, a sheet resistance of the emitter layer was 50Ω.

This substrate was thermally oxidized in an oxygen atmosphere at 1000° C. for three hours to form a mask.

A back surface was opened by a laser. As a laser source, a second harmonic wave of $Nd:YVO_4$ was used. As an opening pattern, a parallel line shape having intervals of 1.2 mm was used. An output was 18 W, and a scan speed was 600 mm/second.

The substrate was immersed in a KOH aqueous solution of 80° C., and the emitter layer in the opening portion was removed.

Then, in a phosphorus oxychloride atmosphere, the light receiving surfaces were stacked and heat-treated at 870° C. for 40 minutes in this state to form a phosphorus diffusion layer (a base layer) in the opening portion.

Thereafter, this substrate was immersed into a hydrofluoric acid having concentration of 12% to remove glass on the surface.

After the treatment, a silicon nitride film was formed on both surfaces with the use of a plasma CVD apparatus. A film thickness was set to 100 nm on both the front and back surfaces.

Subsequently, an Ag paste was printed on the base layer and the emitter layer and then dried, respectively. This substrate was baked in an air atmosphere at 780° C.

On this substrate, as shown in FIG. 7, an insulating material was printed in a pattern shape on fingers and bus bar portions which are regions where bus bars for different conductivity types cross the fingers. A screen printer was used for printing, and a silicone resin manufactured by Shin-Etsu Chemical Co., Ltd. was used as the insulating material. This substrate was cured in a belt furnace at 200° C. for five minutes. A maximum width of the material containing the insulating material is larger than a width of each finger electrode by 100 µm, and a thickness measured from the finger electrode was 4 µm.

Six straight lines of a low-temperature curing Ag paste were printed by the screen printer and cured in the belt furnace at 300° C. for 30 minutes, thereby providing the bus bars. The low-temperature curing Ag paste used herein is provided by mixing an Ag powder in an epoxy resin.

Tab lead wires were soldered to the completed solar cell, the solar cell was held by EVA, PET, and soda-lime glass, a pressure was applied at 140° C. and one atmospheric pressure for 30 minutes, and a module of one solar cell was thereby fabricated.

Example 2

After performing the first step to the 780° C. baking step in the same manner as Example 1, an insulating material was applied to bus bar portions alone as shown in FIG. 8, and curing was carried out.

Then, the same low-temperature curing Ag paste as that in Example 1 was printed by using a screen printer. A printing pattern was a comb-tooth pattern and parallel to six bus bars and exiting finger electrodes (FIG. 9). This was cured in a belt furnace at 300° C. for 30 minutes.

This was processed in the same manner as Example 1 to realize modularization.

Example 3

Tab lead wires were soldered to a solar cell fabricated in the same process as Example 1, the solar cell was held by ionomer, PET, and soda-lime glass, and a pressure was applied at 120° C. and one atmospheric pressure for 30 minutes, thereby fabricating a module of one solar cell.

Comparative Example

After performing the first step to the 780° C. baking step in the same manner as Example 1, an insulating material was applied to bus bar portions alone, and curing was carried out. Further, six straight lines of a low-temperature curing Ag paste were printed by a screen printer, and curing was performed in a belt furnace at 300° C. for 30 minutes to provide bus bars. This was processed in the same manner as Example 1 to realize modularization.
(Evaluation Method)

Current-voltage characteristics of the thus obtained samples of the solar cell were measured by using a solar simulator manufactured by Yamashita Denso Corporation under conditions of an AM 1.5 spectrum, irradiation intensity of 100 mW/cm$^2$, and 25° C., and photoelectric conversion efficiency was obtained.

Furthermore, each sample was put in a temperature and humidity testing chamber set to 85° C. and 85% relative humidity, and it was taken out every 1000 hours to measure the photoelectric conversion efficiency.

FIG. 14 shows obtained results. FIG. 14 is a view showing changes in photoelectric conversion efficiency with time in Examples 1, 2, and 3 and Comparative Example.

Initial (0 hour) characteristics are high in Example 2. For this reason, it is inferred that an actual finger cross-sectional area increased. Time degradation is greatly improved in Examples 1, 2, and 3 as compared with Comparative Example. For this reason, it is considered that covering the upper sides of the finger electrodes with the insulating material enabled suppressing degradation caused due to the filler.

The photovoltaic module according to each of Examples 1 to 3 has the material (a silicone resin or the like) containing the insulating material besides the filler (EVA or the like). That is, in the photovoltaic module of each of Examples 1 to 3, the finger electrodes (the contact electrodes) which are directly joined to the semiconductor substrate of the solar battery cell incorporated in the photovoltaic module are covered with the material different from the filler so that the finger electrodes do not come into contact with the filler of the photovoltaic module. Thus, even when the photovoltaic module of each of Examples 1 to 3 was used for a long time, the photoelectric conversion efficiency was maintained.

It is to be noted that the present invention is not restricted to the foregoing embodiment. The foregoing embodiment is an illustrative example, and any example which has substantially the same configuration and exerts the same functions and effects as the technical concept described in claims of the present invention is included in the technical scope of the present invention.

The invention claimed is:
1. A backside contact solar battery cell comprising a finger electrode and bus bar electrodes on a first main surface of a semiconductor substrate,
wherein the finger electrode includes silver and glass,
the first main surface is a non-light receiving surface of the backside contact solar battery cell,
at least a surface of the finger electrode is covered with a material containing an insulating material so that the surface is not exposed,
the material containing the insulating material does not hydrolyze or does not generate a carboxylic acid when it hydrolyzes, and
the material containing the insulating material further contains conductive particles.
2. The backside contact solar battery cell according to claim 1,
wherein the material containing the insulating material is a thermosetting material.
3. The backside contact solar battery cell according to claim 1,
wherein the material containing at least the insulating material consists of a material containing one or more resins selected from a silicone resin, a polyimide resin, a polyamide imide resin, a polyamide resin, a fluorine resin, a phenol resin, a melamine resin, a urea resin, an epoxy resin, an acrylic resin, a polyester resin, and a poval resin.
4. A photovoltaic module comprising a backside contact solar battery cell according to claim 1 incorporated therein.
5. The photovoltaic module according to claim 4,
wherein the photovoltaic module contains a filler, and the filler is a material containing ethylene vinyl acetate.
6. A photovoltaic power generation system comprising a photovoltaic module according to claim 5.
7. A photovoltaic power generation system comprising a photovoltaic module according to claim 4.
8. A method for manufacturing a backside contact solar battery cell comprising the steps of:
forming a finger electrode including silver and glass on a first main surface of a semiconductor substrate;
forming a bus bar electrode on the first main surface of the semiconductor substrate; and
covering at least a surface of the finger electrode with a material containing an insulating material so that the surface is not exposed,
wherein the first main surface is a non-light receiving surface of the backside contact solar battery cell,
a material which does not hydrolyze or does not generate a carboxylic acid when it hydrolyzes is used as the material containing the insulating material, and
the material which does not hydrolyze or does not generate a carboxylic acid when it hydrolyzes further contains conductive particles.
9. The method for manufacturing a backside contact solar battery cell according to claim 8,
wherein a thermosetting material is used as the material containing the insulating material.
10. The method for manufacturing a backside contact solar battery cell according to claim 8,
wherein a material which consists of a material containing at least one or more resins selected from a silicone resin, a polyimide resin, a polyamide imide resin, a polyamide resin, a fluorine resin, a phenol resin, a melamine resin, a urea resin, an epoxy resin, an acrylic resin, a polyester resin, and a poval resin is used as the material containing the insulating material.

11. A method for manufacturing a photovoltaic module comprising using a backside contact solar battery cell according to claim 8 to manufacture a photovoltaic module having the backside contact solar battery cell incorporated therein.

12. The method for manufacturing a photovoltaic module according to claim 11,
wherein the photovoltaic module contains a filler, and
a material containing ethylene vinyl acetate is used as the filler.

\* \* \* \* \*